United States Patent
Romesburg et al.

(10) Patent No.: US 6,173,056 B1
(45) Date of Patent: Jan. 9, 2001

(54) METHODS FOR ADJUSTING AUDIO SIGNALS RESPONSIVE TO CHANGES IN A POWER SUPPLY LEVEL AND RELATED COMMUNICATIONS DEVICES

(75) Inventors: Eric Romesburg, Chapel Hill; Patrik Lilja, Cary, both of NC (US)

(73) Assignee: Ericsson Inc., Research Triangle Park, NC (US)

( * ) Notice: Under 35 U.S.C. 154(b), the term of this patent shall be extended for 0 days.

(21) Appl. No.: 09/139,825

(22) Filed: Aug. 25, 1998

(51) Int. Cl.$^7$ ........................................... H04B 1/66
(52) U.S. Cl. .................. 379/406; 379/410; 381/104; 381/106; 381/107
(58) Field of Search .................. 379/406, 410, 379/388, 413, 390; 381/46, 104, 106, 107, 94.8

(56) References Cited

U.S. PATENT DOCUMENTS

| | | | |
|---|---|---|---|
| 5,007,046 | * 4/1991 | Erving et al. | 370/32.1 |
| 5,202,918 | * 4/1993 | White | 379/390 |
| 5,253,291 | * 10/1993 | Naseer et al. | 379/406 |
| 5,357,567 | * 10/1994 | Barron et al. | 379/390 |
| 5,557,669 | * 9/1996 | Perry et al. | 379/339 |
| 5,589,796 | 12/1996 | Alberth, Jr. et al. | 330/133 |
| 5,600,718 | 2/1997 | Dent et al. | 379/406 |
| 5,636,323 | * 6/1997 | Umemoto et al. | 704/226 |
| 5,680,450 | 10/1997 | Dent et al. | 379/388 |

FOREIGN PATENT DOCUMENTS

| | | | |
|---|---|---|---|
| 05235814 | 9/1993 | (JP) | H04B/7/15 |

OTHER PUBLICATIONS

International Search Report, International Application No. PCT/US99/17625.

* cited by examiner

*Primary Examiner*—David R. Hudspeth
*Assistant Examiner*—Susan Wieland
(74) *Attorney, Agent, or Firm*—Myers Bigel Sibley & Sajovec

(57) ABSTRACT

The generation of an audio output sound from an electronic communications device includes monitoring a level of an electrical power supply for the electrical communications device, and adjusting an audio input signal responsive to changes of the level of the electrical power supply for the electronic communications device. The adjusted audio input signal is amplified, and an output sound is generated responsive to the adjusted and amplified audio input signal. In addition, an audio output signal can be generated responsive to received sound including an echo of the output sound, an estimate of the echo of the output sound can be generated using the adjusted audio input signal and a model of an echo path of the output sound, and the echo portion of the audio output signal can be reduced using this estimate.

44 Claims, 3 Drawing Sheets

METHODS FOR ADJUSTING AUDIO SIGNALS RESPONSIVE TO CHANGES IN A POWER SUPPLY LEVEL AND RELATED COMMUNICATIONS DEVICES

FIELD OF THE INVENTION

The present invention relates to the field of communications, and more particularly to telephone communications methods and systems.

BACKGROUND OF THE INVENTION

Hands-free loudspeaker radiotelephones have been developed for use in automobiles so that the driver can talk on the radiotelephone while keeping hands free for driving. Accordingly, the driver can operate the automobile with greater concentration while talking on the radiotelephone. The driver does not need to hold a handset to the head because a loudspeaker broadcasts speech transmitted from a remote communications device being used by a remote party throughout the passenger compartment. A microphone is used to pick up the speech in the passenger compartment for transmission to the remote communications device.

An acoustic feedback path from the loudspeaker to the microphone, however, may cause undesired echoes to be transmitted to the remote communications device. Accordingly, echo suppressors have been developed for loudspeaker radiotelephones. In particular, an echo suppressor monitors an input audio signal to be applied to the loudspeaker and models an echo path of this signal from the speaker to the microphone to generate an estimate of the undesired echo portion of the output audio signal generated by the microphone. The echo estimate is then combined with the output audio signal to suppress (or reduce) the echo portion of the signal transmitted to the remote party. Echo suppression is discussed, for example, in U.S. Pat. No. 5,600,718 to Dent et al. entitled Apparatus and Method for Adaptively Precompensating for Loudspeaker Distortions, and in U.S. Pat. No. 5,680,450 to Dent et al. entitled Apparatus and Method for Canceling Acoustic Echoes Including Non-Linear Distortions in Loudspeaker Telephones. The disclosures of these patents are hereby incorporated herein in their entirety by reference.

Non-linear distortions of the input audio signal generated down stream from the point monitored by the echo suppressor, however, may not be modeled by the echo suppressor so that these distortions may result in unwanted echo and/or distortion being transmitted to the remote party. In particular, the echo suppressor may be implemented as a portion of a digital signal processor so that the input audio signal is processed in a digital form and then converted from digital form to analog form before being applied to the loudspeaker. Moreover, a power amplifier can be used to amplify the analog signal from the D-to-A converter before applying the analog signal to the loudspeaker. Accordingly, non-linear distortions caused by the power amplifier may not be accurately modeled by the echo suppressor.

In particular, the maximum output of the power amplifier generally is limited by the level of the electrical voltage supplied thereto. The electrical power supply for a loudspeaker radiotelephone in an automobile, for example, may be an automotive battery with a specified voltage output level of 1 0.8V to 15.6V. As a loss of 0.8V can be expected from the battery to the loudspeaker radiotelephone, the radiotelephone can be expected to operate from a power supply level as low as of 10V. A conventional radiotelephone may thus be designed so that the maximum allowed input signal to the power amplifier does not cause the power amplifier to generate signals having peak-to-peak amplitudes which would be clipped when the power supply is at 10 V, for example.

Situations may occur, however, where an automobile battery voltage is lower than the specified range. This may occur, for example, when the car is not running; when the battery is weak; when the alternator is not operating properly; when the engine is started; when the battery is cold; when the headlight highbeams are on; and/or when many electrical accessories are on. Accordingly, non-linear distortions may be generated by the power amplifier, and these non-linear distortions may cause an increase in echo and/or distortion transmitted to the remote party because the echo suppressor is unable to model these distortions. Moreover, these distortions may be generated at a time when reliable communications are most desired, such as when the user is having car problems.

SUMMARY OF THE INVENTION

It is, therefore, an object of the present invention to provide improved telephone methods and systems.

It is another object of the present invention to provide improved methods of generating sound from electronic devices.

It is still another object of the present invention to provide improved echo suppression for telephones.

These and other objects are provided according to the present invention by adjusting an audio input signal responsive to changes in a power supply level, and then amplifying the adjusted audio input signal. The adjusted and amplified audio input signal is then used to generate sound. Accordingly, clipping during amplification can be reduced or even eliminated. By reducing clipping during amplification, the quality of sound generated by a loudspeaker telephone can be improved. Furthermore, the adjustments prior to amplification can be accounted for during echo suppression.

A method according to the present invention includes the steps of monitoring a level of an electrical power supply for an electrical communications device, and adjusting an audio input signal responsive to changes of the level of the electrical power supply for the electronic communications device. After the adjusting step, the adjusted audio input signal is amplified, and an output sound is generated responsive to the adjusted and amplified audio input signal.

In addition, an audio output signal can be generated responsive to received sound including an echo of the output sound, and an estimate of the echo of the output sound can be generated using the adjusted audio input signal and a model of an echo path of the output sound. This estimate can then be used to suppress an echo portion of the audio output signal. Because the adjustments to the audio input signal are included in the estimate, the echo suppression is improved.

The adjusting step can include adjusting a gain of the audio input signal so that the adjusted audio input signal does not exceed an amplitude that would result in clipping during the amplifying step at the monitored level of the electrical power supply. The quality of the output sound can thus be improved. Alternately, the adjusting step can include clipping portions of the audio input signal which exceed an amplitude that would result in clipping during the amplifying step at the monitored level of the electrical power supply. Accordingly, portions of the audio input signal which would not result in clipping during amplification are not adjusted.

The monitoring step can include detecting a reduction in the level of the electrical power supply, and the adjusting step can include reducing a peak-to-peak swing of the audio input signal responsive to the detected reduction in the level of the electrical power supply. In addition, the monitoring step can include detecting an increase in the level of the electrical power supply, and the adjusting step can include increasing a peak-to-peak swing of the audio input signal responsive to the detected increase in the level of the electrical power supply. Accordingly, the peak-to-peak swings of the audio input signal can track both reductions and increases in the detected power supply level.

According to an alternate aspect of the present invention, a level of an electrical power supply for the electrical communications device is monitored, and a digital audio input signal is adjusted responsive to changes of the level of the electrical power supply for the electronic communications device. The adjusted digital audio input signal is converted to an adjusted analog audio input signal, and an output sound is generated responsive to the adjusted analog audio input signal. Accordingly, a digital signal processor can be used to adjust the audio input signal. Furthermore, the same digital signal processor can be used to provide echo suppression so that the adjusted audio input signal can be used as an input to the echo suppressor.

According to the methods and devices of the present invention, an audio input signal can be adjusted responsive to changes in a power supply level to reduce non-linear distortions when the adjusted signal is amplified and used to generate sound. Echo suppression in a loudspeaker radiotelephone can thus be improved because the adjusted signal can be provided to the echo suppressor and because the addition of non-linear distortions during amplification are reduced.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
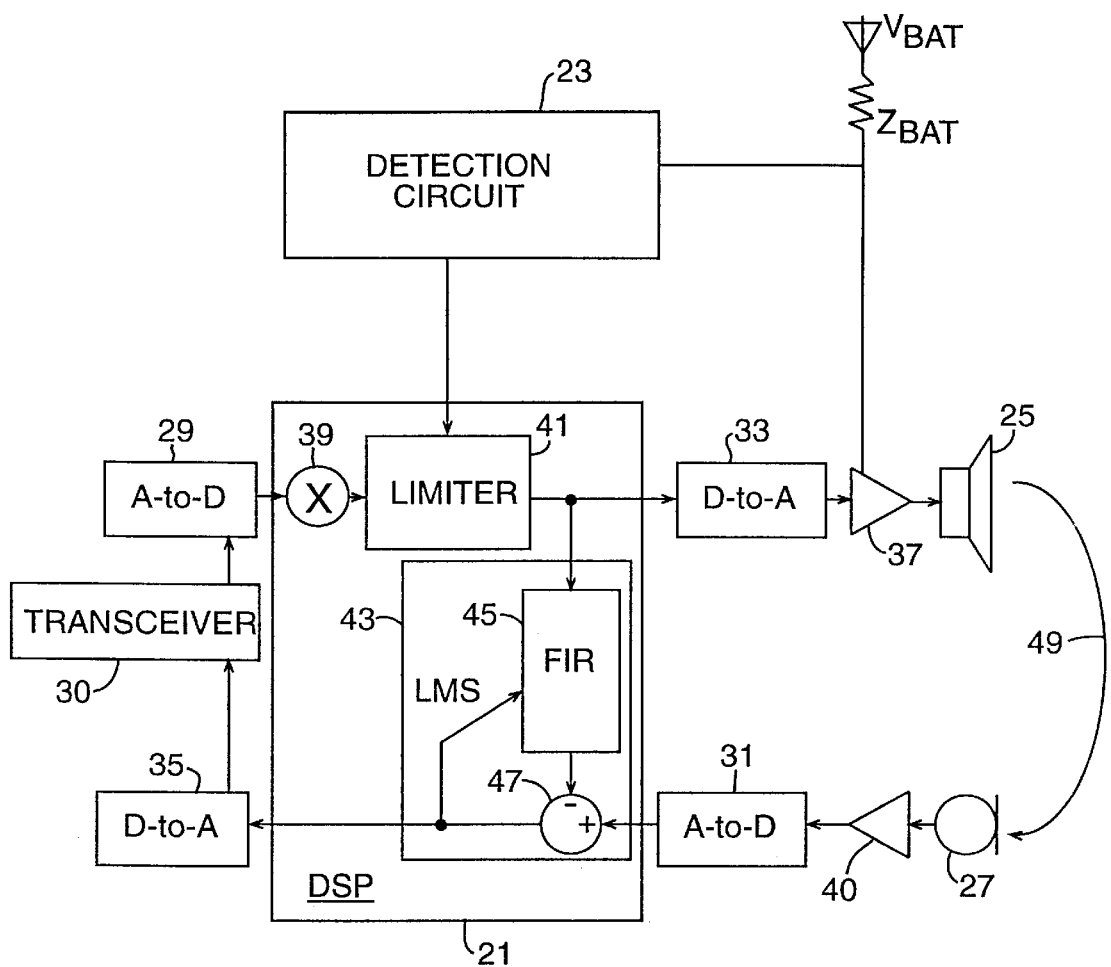
FIG. 1 is a block diagram of a first loudspeaker telephone according to the present invention.

As shown in FIG. 1, a hands-free loudspeaker radiotelephone according to the present invention can include a Digital Signal Processor (DSP) 21, a detection circuit 23, a transceiver 30, a loudspeaker 25, a microphone 27, analog-to-digital (A-to-D) converters 29 and 31, digital-to-analog (D-to-A) converters 33 and 35, and amplifiers 37 and 40. In addition, the digital signal processor 21 includes a volume gain control 39, a limiter 41, and an echo suppressor 43 wherein the echo suppressor 43 includes an adaptive LMS FIR filter 45 and a subtractor 47. Moreover, an electrical power supply for the telephone provides an electrical power level (such as a voltage) $V_{BAT}$ through an impedance $Z_{BAT}$. In a hands-free loudspeaker radiotelephone, for example, the electrical power supply can be an automobile battery providing a power supply level in the range of 10.8 V to 15.6 V. Because of the impedance $Z_{BAT}$ which may result in a loss of 0.8 V, however, a typical power supply level in the range of 10 V to 14.8 V may actually be provided to the amplifier 37 and to the detection circuit 23.

In the radiotelephone of FIG. 1, an audio input signal from a remote communications device is provided from the transceiver 30 to the analog-to-digital converter 29, for conversion to a digital audio input signal that can be processed by the digital signal processor 21. Alternately, a digital signal can be received from the remote communications device eliminating the need for the analog-to-digital converter 29. The gain of the digital audio input signal is adjusted using the volume gain control 39, and portions of the digital audio signal can be limited using the limiter 41. The processed digital audio input signal is then converted back to an analog signal using digital-to-analog converter 33, and amplified using power amplifier 37 before being applied to the loudspeaker 25 to reproduce speech of the remote party.

In the other direction, a microphone 27 generates an analog audio output signal in response to sounds such as the speech of the user, and this analog audio output signal can be amplified using amplifier 40 and converted to a digital audio output signal using analog-to-digital converter 31. The microphone 27, however, may also pick up an echo 49 of the sound generated by the loudspeaker 25 resulting in undesired feedback to the remote communications device. Accordingly, the echo suppressor 43 generates an estimate of the echo which is subtracted from the digital audio output signal. In particular, an adaptive LMS FIR filter 45 estimates the echo using the digital audio input signal from the limiter 41, and this estimate is subtracted from the digital audio output signal using the subtractor 47. The processed digital audio output signal can then be converted to a processed analog audio output signal using the digital-to-analog converter 35. Alternately, the processed digital audio output signal can be transmitted to the remote communications device for transmission through the transceiver 30 without digital-to-analog conversion in a digital communications system eliminating the need for the digital-to-analog converter 35.

Non-linear distortions of the audio input signal introduced downstream from the digital signal processor 21, however, may not be included in the echo path model of the echo suppressor 43 so that these non-linear distortions result in echoes that are not cancelled by the echo suppressor and undesired noise is transmitted to the remote communications device. In particular, variations of the power supply level $V_{BAT}$ may result in undesired clipping of the processed analog audio input signal at the power amplifier 37.

As discussed above, the power supply level $V_{BAT}$ may vary, and the maximum output of the power amplifier may be limited by the level of the electrical power supplied thereto. Accordingly, the power amplifier 37 may clip the processed analog audio input signal if the power supply level $V_{BAT}$ drops, and this clipping may not be accurately modeled in the echo suppressor 43. According to the present invention, the detection circuit 23 monitors the power supply level $V_{BAT}$ and provides information to the DSP 21 so that the DSP can adjust the digital audio input signal to reduce clipping at the power amplifier. As shown in FIG. 1, the detection circuit can adjust the operation of the limiter 41 in response to changes in the electrical power supply level $V_{BAT}$.

In particular, the limiter 41 limits portions of the digital audio input signal so that a peak-to-peak swing of the digital audio input signal does not exceed a predetermined threshold. In other words, the limiter 41 clips portions of the audio input signal so that the peak-to-peak swing of the digital audio input signal does not exceed the threshold. By adjusting this threshold responsive to changes in the power supply level, clipping at the power amplifier is reduced, and the clipped signal is provided to the input of the echo suppressor so that the clipping can be accounted for during echo suppression. By adjusting the limiter, only portions of the audio input signal which exceed the threshold are affected, while other portions of the signal maintain a desired amplitude/gain. It will be understood that a "soft" limiter may be used so that soft clipping of the audio input signal may take place to thereby reduce distortion in the clipped audio signal.

In other words, when the detection circuit 23 determines that the power supply level is reduced and clipping at the power amplifier 37 may occur, the detection circuit 23 provides information to the limiter allowing the limiter 41 to preemptively clip the digital audio input signal so that the clipping does not occur at the power amplifier 37 and so that the clipping is detected at the echo suppressor 43. Similarly, when the detection circuit 23 determines that the power supply level is increased, the detection circuit provides information to the limiter allowing the limiter to reduce clipping to enhance the quality of the output sound.

Figure 2:
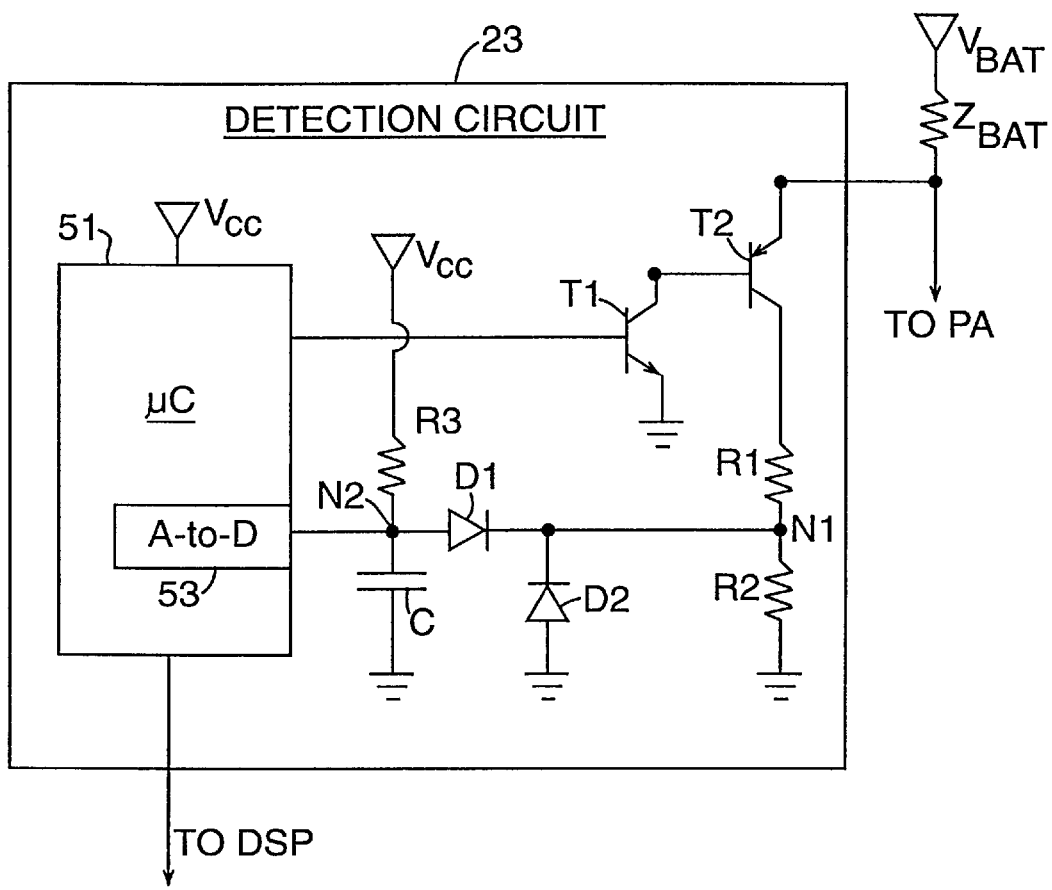
FIG. 2 is a schematic diagram of a detection circuit according to FIG. 1.

The detection circuit 23 is shown in greater detail in FIG. 2. As shown, the detection circuit 23 can include transistors T1 and T2; diodes D1 and D2; resistors R1 and R2; capacitor C; and microcomputer ($\mu$C) 51 wherein the microcomputer 51 can include an analog-to-digital converter 53. Alternately, the analog-to-digital converter 53 can be provided separately from the microcomputer 51. The resistors R1 and R2 provide a voltage divider to scale the power supply level; the transistors T1 and T2 provide a switch to cut off current through the voltage divider when the radiotelephone is turned off; and the resistor R3, capacitor C, and diode D1 provide a filter that functions as a low peak voltage detector. The diode D2 provides circuit protection.

In particular, the resistors R1 and R2 can have respective resistances of 5.6 kohms and 1.0 kohms so that the full range of output levels of the power supply are scaled to a range that can be read using the analog-to-digital converter 53. This scaling allows measurement of power supply levels ranging from 0 V to 18 V. In addition, a circuit supply voltage Vcc can be approximately 3.3 Volts, the resistor R3 can have a resistance of 100 kohms, and the capacitor C can have a capacitance of 100 nF. Accordingly, the capacitor C is charged through the resistor R3 from the circuit supply voltage Vcc, and the capacitor C is discharged through the diode D1 and the resistor R2 to ground. The voltage across the capacitor C is periodically sampled using the analog-to-digital converter 53 and the microcomputer 51.

Figure 3:
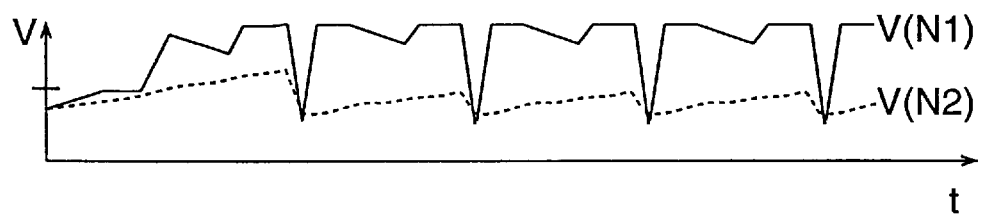
FIG. 3 is a graph illustrating voltage waveforms at nodes N1 and N2 of FIG. 2.

Because of the relative resistances of the resistors R2 and R3 (R3 is 100 times greater than R2), the capacitor will charge more slowly through resistor R3 than it will discharge through resistor R2 to provide a negative peak detector. An illustration of the operation of the negative peak detector is provided graphically in FIG. 3. As shown, the voltage V(N1) at node N1 is the scaled power supply level VBAT, and the voltage V(N2) is the voltage across the capacitor of the negative peak detector. As shown, the voltage V(N2) responds very quickly to drops (negative peaks) in the voltage V(N1), but the voltage V(N2) responds slowly to increases in the voltage V(N1). In other words, the voltage V(N2) approximates the negative peaks of the voltage V(N1). As will be understood by those having skill in the art, the magnitude of the voltage V(N2) is greatly exaggerated with respect to the magnitude of the voltage V(N1) for the purposes of illustrating the slow rise and rapid fall. In actuality, the voltage V(N2) appears much flatter with respect to the voltage V(N1) so that the voltage V(N2) does actually approximate the negative peaks of the voltage V(N1). In other words, the voltage V(N2) is locked to the negative peaks of the voltage V(N1) to provide negative peak detection.

Because the voltage at the node N2 approximates the negative peaks of the scaled power supply lever, the sampling frequency of the analog-to-digital converter 53 can be reduced. In other words, the resistor R3 and the capacitor C provide a low-pass filter that approximates (locks to) the negative peaks. This low-pass filter also reduces spikes from sources such as the vehicle ignition and the generator. Alternately, the negative peak detector (including resistor R3, capacitor C, and diode D1) can be eliminated if the sampling frequency is increased.

The samples generated by the analog-to-digital converter 53 are processed by the microcomputer 51 to determine if the power supply level has changed and to provide appropriate information to the digital signal processor 21. For example, the microcomputer can read the value generated by the analog-to-digital converter 53 once every 10 milliseconds, and the microcomputer can save the lowest measured value over 300 milliseconds in a list of thirty values. The lowest value in this list of thirty values is used to represent the power supply level. Accordingly, this representative value is the lowest value read in the most recent 300-millisecond period of time. This representative value is provided to the digital signal processor 21 to allow adjustment of the limiter as discussed above with regard to FIG. 1.

The transistors T1 and T2 provide a switch to shut off current through the voltage divider when the telephone is not in use. In particular, a low level signal from the microcomputer will turn transistor T1 off putting transistor T2 in a high impedance state. Alternately, a high level signal from the microcomputer will turn the transistor T1 on putting the transistor T2 in a low impedance state.

As will be appreciated by those of skill in the art, the above described aspects of the present invention in FIGS. 1 and 2 may be provided by hardware, software, firmware, or a combination thereof. While various components of the apparatus of the present invention have been illustrated in part as discrete elements in the Figures, they may, in practice, be implemented by one or more microcontrollers including input and output ports and running software/firmware code, by customer or hybrid chips, by discrete components, or by a combination of the above. In particular, the digital signal processor 21 and the microcomputer 51 can be implemented using a single custom or standard integrated circuit device, or multiple custom and/or standard integrated circuit devices can be used.

Particular parameters for the elements of the detection circuit 23 can be provided as follows: the saturated collector-emitter voltage ($V_{CE-SAT}$) for transistor T2 can be −0.3 V; the resistance of resistor R1 can be 5.6 kohm; the resistance of resistor R2 can be 1.0 kohm; and the forward voltage drop ($V_f$) across diode D1 can be 0.5 V. Using these parameters, Table 1 lists examples of inputs and outputs to the analog-to-digital converter 53 corresponding to respective power supply levels (Vehicle battery voltage).

TABLE 1

| Vehicle battery voltage (V) | ADC input voltage (V) | ADC Hex value 10-bit resolution (word) | 8-bit resolution (byte) |
|---|---|---|---|
| 0 | 0.5 | $0096_H$ | $25_H$ |
| 6 | 1.36 | $01A6_H$ | $69_H$ |
| 7 | 1.52 | $01D7_H$ | $75_H$ |
| 8 | 1.67 | $0206_H$ | $81_H$ |
| 9 | 1.82 | $0234_H$ | $8D_H$ |
| 10 | 1.97 | $0263_H$ | $98_H$ |
| 11 | 2.12 | $0291_H$ | $A4_H$ |
| 12 | 2.27 | $02C0_H$ | $B0_H$ |
| 13 | 2.42 | $02EE_H$ | $BB_H$ |
| 14 | 2.58 | $0320_H$ | $C8_H$ |
| 15 | 2.73 | $034F_H$ | $D3_H$ |
| 16 | 2.88 | $037D_H$ | $DF_H$ |
| 17 | 3.03 | $03AC_H$ | $EB_H$ |
| 18 | 3.18 | $03DA_H$ | $F6_H$ |

In Table 1, the Vehicle battery voltage is the power supply level $V_{BAT}$, and the ADC (analog-to-digital converter 53) input voltage is the voltage at node N1.

Using the systems and methods discussed above, a maximum allowed output from the digital-to-analog converter 33 is determined by the power supply level (such as the automobile battery voltage). If the analog audio input signal to the loudspeaker 25 can have a maximum peak-to-peak level when the power supply voltage is 14 V, Table 2 provides examples of maximum digital levels that can be provided to the digital-to-analog converter 33 for different power supply levels (Battery Voltage).

TABLE 2

| Battery voltage ($V_{Bat}$) | Level (dB) | DSP max. output level from a 16-bit codec ($xxxx_H$) | Absolute Level (dBV) |
|---|---|---|---|
| <6.25 | -∞ | $0000_H$ | -∞ |
| ≧6.25 | -7.0 | $392C_H$ | 15.92 |
| ≧6.62 | -6.5 | $3C8F_H$ | 16.42 |
| ≧7.02 | -6.0 | $4026_H$ | 16.92 |
| ≧7.43 | -5.5 | $43F3_H$ | 17.42 |
| ≧7.87 | -5.0 | $47FA_H$ | 17.92 |
| ≧8.34 | -4.5 | $4C3E_H$ | 18.42 |
| ≧8.83 | -4.0 | $50C2_H$ | 18.92 |
| ≧9.36 | -3.5 | $558B_H$ | 19.42 |
| ≧9.91 | -3.0 | $5A9D_H$ | 19.92 |
| ≧10.50 | -2.5 | $5FFB_H$ | 20.42 |
| ≧11.12 | -2.0 | $65AB_H$ | 20.92 |
| ≧11.78 | -1.5 | $6BB1_H$ | 21.42 |
| ≧12.48 | -1.0 | $7213_H$ | 21.92 |
| ≧13.22 | -0.5 | $78D6_H$ | 22.42 |
| ≧14.00 | 0.0 | $7FFF_H$ | 22.92 |

In Table 2, the Level (dB) is calculated using the formula:

$$dB = 20 * \log(V_{BAT}/V_{MAX}),$$

where $V_{MAX} = 14.0V$. The audio signal to the loudspeaker can be muted if the battery voltage is less than 6.25V, as shown in Table 2. The digital signal processor can use the information from the detection circuit 23 together with other information, such as a volume input, background noise levels, etc., to adjust the digital audio input signal. In particular, if the desired amplitude of a portion of the audio input signal is greater than the maximum amplitude allowed as a result of a drop in the power supply level (battery voltage), the digital audio input signal can be limited using limiter 41 to reduce clipping at the amplifier 37. It may also be useful to scale the values of Table 2 to compensate for overshoot in the digital-to-analog converter.

As an example to illustrate operations according to the present invention, with a measured battery voltage of 12.48 V, the digital signal processor of the present invention may determine that the digital audio input signal should have a peak magnitude of $7213_H$ (using a 16-bit codec digital-to-analog converter). If the battery voltage increases to 14 V, the digital signal processor may determine that the audio input signal should have a peak magnitude of $7FFF_H$. If the battery voltage drops to 11.12 V when the high beam headlights are turned on, however, clipping may occur at the amplifier 37. Accordingly, upon detection of the power supply level drop to 11.12 V, the digital signal processor may limit the digital audio input signal to $65AB_H$ (using a 16-bit codec digital-to-analog converter). The limiter can perform either hard or soft clipping. Accordingly, the maximum digital-to-analog converter output can be increased with increased battery voltages to provide greater volume and/or lower distortion, and the digital-to-analog converter output can be reduced with reduced battery voltages to reduce distortions generated by the amplifier and to improve echo cancellation.

As discussed above, the digital audio input signal can be adjusted using the limiter 41 to limit the maximum value of the digital audio input signal. This has the advantage that only portions of the signal exceeding the maximum value are limited while all other portions of the signal maintain the desired gain.

Figure 4:
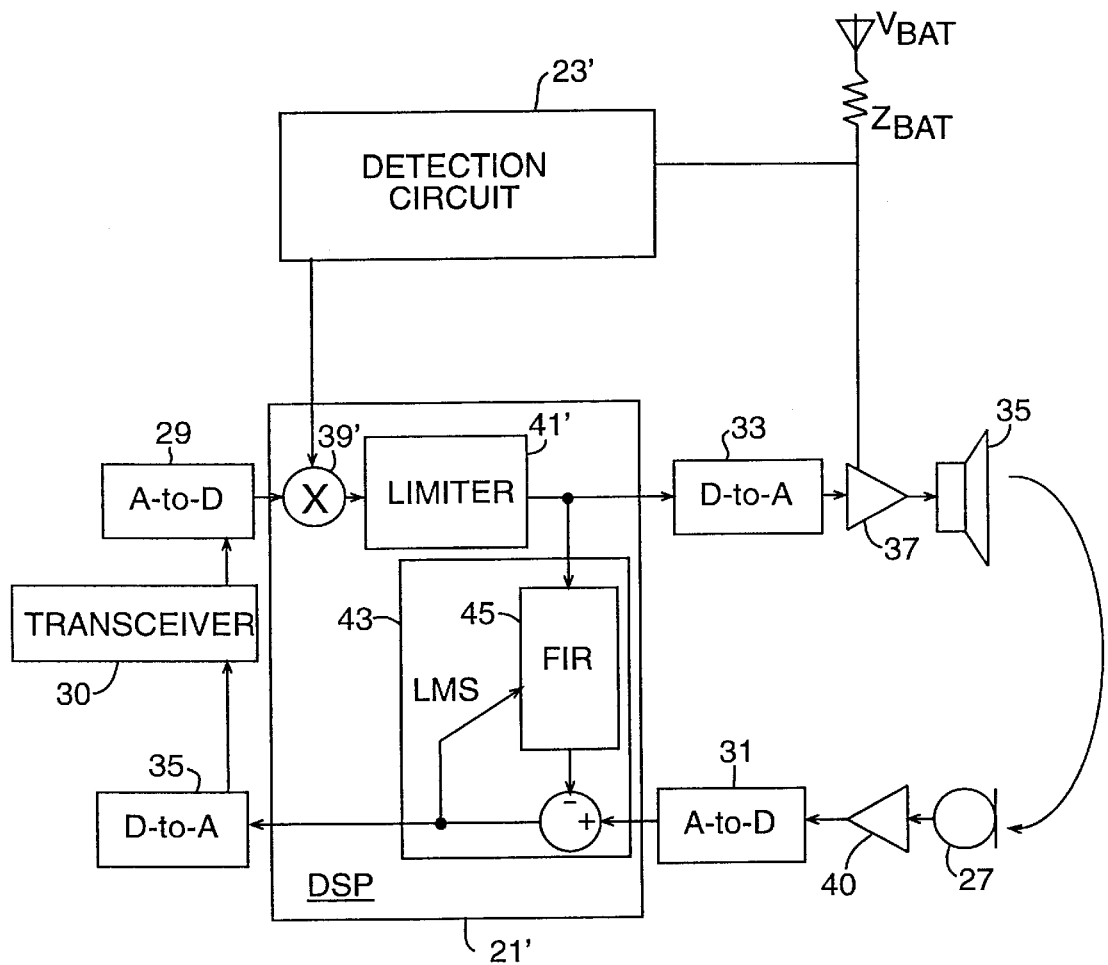
FIG. 4 is a block diagram of a second loudspeaker telephone according to the present invention.

According to an alternate aspect of the present invention illustrated in FIG. 4, the operation of the volume gain control 39' is adjusted in response to changes in the power supply level. Accordingly, the overall gain of the digital audio input signal may be reduced when the power supply level is reduced to reduce clipping at the amplifier 37. While this means that the gain of portions of the signal which would not cause clipping may be reduced, this also means that the overall quality of the sound generated by the loudspeaker can be increased. The limiter 41' is not adjusted responsive to the detection circuit 23'.

In the drawings and specification, there have been disclosed typical preferred embodiments of the invention and, although specific terms are employed, they are used in a generic and descriptive sense only and not for purposes of limitation, the scope of the invention being set forth in the following claims. While the present invention has been discussed above with reference to hands-free loudspeaker radiotelephones in automobiles, the methods and systems of the present invention can be used in other communications devices. For example, the methods and systems of the present invention can be used in radiotelephones having handsets wherein short-echo cancellation is used to suppress echos from the speaker to the microphone. Moreover, the methods and systems of the present invention can be used in any communications device where power supply levels provided to a speaker amplifier may vary.

That which is claimed is:

1. A method of generating an audio output sound from an electronic communications device, said method comprising the steps of:
    monitoring a level of an electrical power supply for the electrical communications device;
    adjusting an audio input signal responsive to changes of the level of the electrical power supply for the electronic communications device;
    after the adjusting step, amplifying the adjusted audio input signal; and
    generating an output sound responsive to the adjusted and amplified audio input signal.

2. A method according to claim 1 further comprising the step of:
   generating an audio output signal responsive to received sound including an echo of the output sound;
   generating an estimate of the echo of the output sound using the adjusted audio input signal and a model of an echo path of the output sound; and
   suppressing an echo portion of the audio output signal using the estimate of the echo of the output sound.

3. A method according to claim 1 wherein the adjusting step comprises adjusting a gain of the audio input signal so that the adjusted audio input signal does not exceed an amplitude that would result in clipping during the amplifying step at the monitored level of the electrical power supply.

4. A method according to claim 1 wherein the adjusting step comprises clipping portions of the audio input signal which exceed an amplitude that would result in clipping during the amplifying step at the monitored level of the electrical power supply.

5. A method according to claim 1 wherein the monitoring step comprises detecting a reduction in the level of the electrical power supply, and wherein the adjusting step comprises reducing a peak-to-peak swing of the audio input signal responsive to the detected reduction in the level of the electrical power supply.

6. A method according to claim 1 wherein the monitoring step comprises detecting an increase in the level of the electrical power supply, and wherein the adjusting step comprises increasing a peak-to-peak swing of the audio input signal responsive to the detected increase in the level of the electrical power supply.

7. A method according to claim 1 wherein the monitoring step comprises periodically sampling the level of the electrical power supply, storing a predetermined number of the sampled levels, and choosing the lowest of the stored samples to represent the level of the electrical power supply.

8. A method according to claim 1 wherein the monitoring step comprises scaling the level of the electrical power supply and filtering the scaled level to approximate negative peaks of the level of the electrical power supply.

9. A method according to claim 1 wherein the electrical power supply comprises a battery.

10. A method according to claim 9 wherein the battery comprises an automobile battery.

11. A method according to claim 1 wherein the step of adjusting the audio input signal comprises adjusting a digital audio input signal, wherein the amplifying step is preceded by the step of converting the digital adjusted audio input signal to an analog adjusted audio input signal, and wherein the amplifying step comprises amplifying the analog adjusted audio input signal.

12. A method of generating an audio output sound from an electronic communications device, said method comprising the steps of:
   monitoring a level of an electrical power supply for the electrical communications device;
   adjusting a digital audio input signal responsive to changes of the level of the electrical power supply for the electronic communications device;
   converting the adjusted digital audio input signal to an adjusted analog audio input signal; and
   generating an output sound responsive to the adjusted analog audio input signal.

13. A method according to claim 12 further comprising the step of:
   generating an audio output signal responsive to received sound including an echo of the output sound;
   generating an estimate of the echo of the output sound using the adjusted digital audio input signal and a model of an echo path of the output sound; and
   suppressing an echo portion of the audio output signal using the estimate of the echo of the output sound.

14. A method according to claim 12 wherein the generating step is preceded by the step of:
   amplifying the adjusted analog audio input signal.

15. A method according to claim 14 wherein the adjusting step comprises adjusting a gain of the digital audio input signal so that the adjusted digital audio input signal does not exceed an amplitude that would result in clipping during the amplifying step at the monitored level of the electrical power supply.

16. A method according to claim 14 wherein the adjusting step comprises clipping portions of the adjusted digital audio input signal which exceed an amplitude that would result in clipping during the amplifying step at the monitored level of the electrical power supply.

17. A method according to claim 12 wherein the monitoring step comprises detecting a reduction in the level of the electrical power supply, and wherein the adjusting step comprises reducing a peak-to-peak swing of the adjusted digital audio input signal responsive to the detected reduction in the level of the electrical power supply.

18. A method according to claim 12 wherein the monitoring step comprises detecting an increase in the level of the electrical power supply, and wherein the adjusting step comprises increasing a peak-to-peak swing of the adjusted digital audio input signal responsive to the detected increase in the level of the electrical power supply.

19. A method according to claim 12 wherein the monitoring step comprises periodically sampling the level of the electrical power supply, storing a predetermined number of the sampled levels, and choosing the lowest of the stored samples to represent the level of the electrical power supply.

20. A method according to claim 12 wherein the monitoring step comprises scaling the level of the electrical power supply and filtering the scaled level to approximate negative peaks of the level of the electrical power supply.

21. A method according to claim 12 wherein the electrical power supply comprises a battery.

22. A method according to claim 21 wherein the battery comprises an automobile battery.

23. An electronic communications device comprising:
   a monitoring circuit that monitors a level of an electrical power supply for the electronic communications device;
   an adjusting circuit coupled to the monitoring circuit that adjusts an audio input signal responsive to changes of the level of the power supply;
   an amplifier coupled to the adjusting circuit that amplifies the adjusted audio input signal; and
   an speaker coupled to the amplifier that generates an output sound responsive to the adjusted and amplified audio input signal.

24. An electronic communications device according to claim 23 further comprising:
   a microphone that generates an audio output signal responsive to received sound including an echo of the output sound; and
   an echo filter that generates an estimate of the echo of the output sound using the adjusted audio input signal and a model of an echo path of the output sound, and that suppresses an echo portion of the audio output signal using the estimate of the echo of the output sound.

25. An electronic communications device according to claim 23 wherein the adjusting circuit adjusts a gain of the audio input signal so that the adjusted audio input signal does not exceed an amplitude that would result in clipping during the amplifying step at the monitored level of the electrical power supply.

26. An electronic communications device according to claim 23 wherein the adjusting circuit clips portions of the audio input signal which exceed an amplitude that would result in clipping at the amplifier at the monitored level of the electrical power supply.

27. An electronic communications device according to claim 23 wherein the monitoring circuit detects a reduction in the level of the electrical power supply, and wherein the adjust circuit reduces a peak-to-peak swing of the audio input signal responsive to the detected reduction in the level of the electrical power supply.

28. An electronic communications device according to claim 23 wherein the monitoring circuit detects an increase in the level of the electrical power supply, and wherein the adjusting circuit increases a peak-to-peak swing of the audio input signal responsive to the detected increase in the level of the electrical power supply.

29. An electronic communications device according to claim 23 wherein the monitoring circuit periodically samples the level of the electrical power supply, storing a predetermined number of the sampled levels and choosing the lowest of the stored samples to represent the level of the electrical power supply.

30. An electronic communications device according to claim 23 wherein the monitoring circuit scales the level of the electrical power supply and filters the scaled level to approximate negative peaks of the level of the electrical power supply.

31. An electronic communications device according to claim 23 wherein the electrical power supply comprises a battery.

32. An electronic communications device according to claim 31 wherein the battery comprises an automobile battery.

33. An electronic communications device according to claim 23 wherein the adjusting circuit adjusts a digital audio input signal, the device further comprising:
  a digital-to-analog converter between the adjusting circuit and the amplifier that converts the adjusted digital audio input signal to an adjusted analog audio input signal so that the amplifier amplifies the adjusted analog audio input signal.

34. An electronic communications device comprising:
  a monitoring circuit that monitors a level of an electrical power supply for the electrical communications device;
  an adjusting circuit coupled to the monitoring circuit that adjusts a digital audio input signal responsive to changes of the level of the electrical power supply for the electronic communications device;
  a converter coupled to the adjusting circuit that converts the adjusted digital audio input signal to an adjusted analog audio input signal; and
  a speaker coupled to the converter that generates an output sound responsive to the adjusted analog audio input signal.

35. An electronic communications device according to claim 34 further comprising:
  a microphone that generates an audio output signal responsive to received sound including an echo of the output sound;
  an echo filter that generates an estimate of the echo of the output sound using the adjusted digital audio input signal and a model of an echo path of the output sound and suppresses an echo portion of the audio output signal using the estimate of the echo of the output sound.

36. An electronic communications device according to claim 34 further comprising:
  an amplifier coupled between the adjusting circuit and the speaker that amplifies the adjusted analog audio input signal.

37. An electronic communications device according to claim 36 wherein the adjusting circuit adjusts a gain of the digital audio input signal so that the adjusted digital audio input signal does not exceed an amplitude that would result in clipping at the amplifier at the monitored level of the electrical power supply.

38. An electronic communications device according to claim 36 wherein the adjusting circuit clips portions of the adjusted digital audio input signal which exceed an amplitude that would result in clipping during at the amplifier at the monitored level of the electrical power supply.

39. An electronic communications device according to claim 34 wherein the monitoring circuit detects a reduction in the level of the electrical power supply, and wherein the adjusting circuit reduces a peak-to-peak swing of the adjusted digital audio input signal responsive to the detected reduction in the level of the electrical power supply.

40. An electronic communications device according to claim 34 wherein the monitoring circuit detects an increase in the level of the electrical power supply, and wherein the adjusting circuit increases a peak-to-peak swing of the adjusted digital audio input signal responsive to the detected increase in the level of the electrical power supply.

41. An electronic communications device according to claim 34 wherein the monitoring circuit periodically samples the level of the electrical power supply, storing a predetermined number of the sampled levels and choosing the lowest of the stored samples to represent the level of the electrical power supply.

42. An electronic communications device according to claim 34 wherein the monitoring circuit scales the level of the electrical power supply and filters the scaled level to approximate negative peaks of the level of the electrical power supply.

43. An electronic communications device according to claim 34 wherein the electrical power supply comprises a battery.

44. An electronic communications device according to claim 43 wherein the battery comprises an automobile battery.

* * * * *